(12) United States Patent
Cooper et al.

(10) Patent No.: US 7,387,970 B2
(45) Date of Patent: Jun. 17, 2008

(54) METHOD OF USING AN AQUEOUS SOLUTION AND COMPOSITION THEREOF

(75) Inventors: Kevin E. Cooper, La Terrasse (FR); John C. Flake, Montbonnot (FR); Johannes Groschopf, Wainsdorf (DE); Yuri E. Solomentsev, Allen, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 508 days.

(21) Appl. No.: 10/430,987

(22) Filed: May 7, 2003

(65) Prior Publication Data
US 2004/0224426 A1    Nov. 11, 2004

(51) Int. Cl.
 H01L 21/304    (2006.01)
 H01L 21/306    (2006.01)
 C23F 1/14    (2006.01)

(52) U.S. Cl. .................. 438/754; 438/692; 216/105

(58) Field of Classification Search .............. 51/298; 438/692, 693, 745, 754; 216/99, 100, 105
See application file for complete search history.

(56) References Cited

U.S. PATENT DOCUMENTS

| | | | | |
|---|---|---|---|---|
| 2,917,480 | A * | 12/1959 | Bailey et al. | 525/477 |
| 3,629,310 | A * | 12/1971 | Bailey et al. | 556/444 |
| 4,080,375 | A | 3/1978 | Quinlan | |
| 5,114,607 | A * | 5/1992 | Deck et al. | 510/254 |
| 5,266,088 | A * | 11/1993 | Sandusky et al. | 51/298 |
| 5,814,588 | A * | 9/1998 | Cala et al. | 510/175 |
| 5,985,810 | A * | 11/1999 | Inada et al. | 510/175 |
| 6,069,210 | A * | 5/2000 | Cartridge et al. | 525/409 |
| 6,270,393 | B1 * | 8/2001 | Kubota et al. | 451/36 |
| 6,468,910 | B1 | 10/2002 | Srinivasan et al. | |
| 6,491,843 | B1 | 12/2002 | Srinivasan et al. | |
| 6,503,418 | B2 | 1/2003 | Sahota et al. | |
| 6,544,892 | B2 | 4/2003 | Srinivasan et al. | |
| 6,627,107 | B2 | 9/2003 | Srinivasan et al. | |
| 6,632,259 | B2 * | 10/2003 | Weinstein et al. | 51/298 |
| 6,720,264 | B2 * | 4/2004 | Sahota et al. | 438/692 |
| 6,794,285 | B2 * | 9/2004 | Matsui et al. | 438/633 |
| 6,902,590 | B2 * | 6/2005 | Weinstein et al. | 51/298 |

(Continued)

FOREIGN PATENT DOCUMENTS

WO    WO 02/051955 A1    7/2002

OTHER PUBLICATIONS

"Use of Nonionic Surfactant to Reduce Sulfuric Acid Mist in the Copper Electrowinning Process," Arizona State University, Dec. 1999, pp. I-VIII & 1-54.

*Primary Examiner*—M. Wilczewski
(74) *Attorney, Agent, or Firm*—Kim-Marie Vo; Joanna G. Chiu

(57) ABSTRACT

A method for processing semiconductor wafers is disclosed. A semiconductor wafer is provided to a semiconductor processing stage where a block copolymer surfactant (BCS) is applied to the wafer surface. In one embodiment, the BCS includes a hydrophobic portion and a hydrophilic portion. Alternatively, the BCS may be a silicone-containing BCS. In one embodiment, the BCS is within an aqueous solution where the concentration of the BCS within the aqueous solution is less than one percent by weight. Also disclosed is an aqueous solution including abrasive particles and a BCS having a hydrophobic portion and a hydrophilic portion. The abrasive particles may include silica, alumina, or ceria.

6 Claims, 1 Drawing Sheet

U.S. PATENT DOCUMENTS

| | | |
|---|---|---|
| 6,936,543 B2* | 8/2005 | Schroeder et al. .......... 438/692 |
| 6,988,936 B2* | 1/2006 | Filipozzi et al. .............. 451/41 |
| 6,989,414 B2* | 1/2006 | Sata et al. ................... 524/375 |
| 2002/0005504 A1 | 1/2002 | Sahota et al. |
| 2003/0051413 A1* | 3/2003 | Sakai et al. ................... 51/307 |
| 2003/0104699 A1* | 6/2003 | Minamihaba et al. ....... 438/692 |
| 2003/0171456 A1* | 9/2003 | Tong et al. ................. 523/404 |
| 2004/0014319 A1 | 1/2004 | Sahota et al. |
| 2004/0224426 A1* | 11/2004 | Cooper et al. .................. 438/2 |
| 2004/0224521 A1* | 11/2004 | Flake et al. ................. 438/692 |
| 2005/0009322 A1* | 1/2005 | Matsui et al. ............... 438/633 |
| 2005/0130428 A1* | 6/2005 | Choi et al. .................. 438/690 |
| 2005/0221016 A1* | 10/2005 | Glatkowski et al. ........ 427/444 |
| 2005/0221615 A1* | 10/2005 | Toyota et al. ............... 438/692 |
| 2006/0014390 A1* | 1/2006 | Lee et al. .................... 438/692 |
| 2008/0026583 A1* | 1/2008 | Hardy et al. ................ 438/693 |

* cited by examiner

METHOD OF USING AN AQUEOUS SOLUTION AND COMPOSITION THEREOF

FIELD OF THE INVENTION

The invention relates generally to the field of semiconductors and more specifically to chemical mechanical polishing (CMP).

BACKGROUND OF THE INVENTION

Chemical mechanical polishing (CMP) has been widely adopted in semiconductor manufacturing process for planarization of a layer, especially a copper layer, on a wafer surface. More specifically, a copper layer is deposited over a dielectric layer to fill openings within the dielectric layer. To remove portions of the copper layer that are not within the openings (i.e., to form interconnects that are electrically isolated from each other), a slurry and a pad are used. Typically, the wafer is rinsed immediately following planarization (i.e., while the wafer is still in contact with the pad) to remove any unwanted surface defects, such as slurry particles or other residuals. Additional rinsing may be performed after transferring the wafer to a scrubber or noncontact cleaning tool to remove any surface defects that were not removed during the rinse on the pad.

Due to the complex nature of the chemistry and CMP process, it is possible that components of the slurry react with the copper layer to form defects on the surface of the wafer because as the amount of copper that is exposed during planarization increases (e.g. an increase in the number of openings and/or the size of openings), the number of surface defects also increases. The surface defects are typically less than 1 centimeter in area and are commonly referred to as stains, precipitates, carbon particles, carbon residual, slurry residual, or organic residuals. Much is unknown as to the exact cause and the exact composition of the surface precipitates. However, they are believed to be clusters, of material that include carbon. It is desirable to decrease the number of surface defects as they lead to yield loss.

One proposed solution to minimize defects is to use polyethylene glycol (PEG) as a surfactant in the slurry. However, the addition of PEG does not consistently decrease surface defects. In addition, concentrations in excess of 1 weight percent (10000 ppm) of PEG may need to be added to the slurry. The relatively high concentration of PEG can cause several problems including poor filtration and has a negative cost impact. Therefore, there is a need for a reliable solution to minimize surface defects that does not require large additive concentrations.

BRIEF DESCRIPTION OF THE DRAWINGS

The present invention is illustrated by way of example and not limited by the accompanying figures, in which like references indicate similar elements, and in which.

Figure 1:
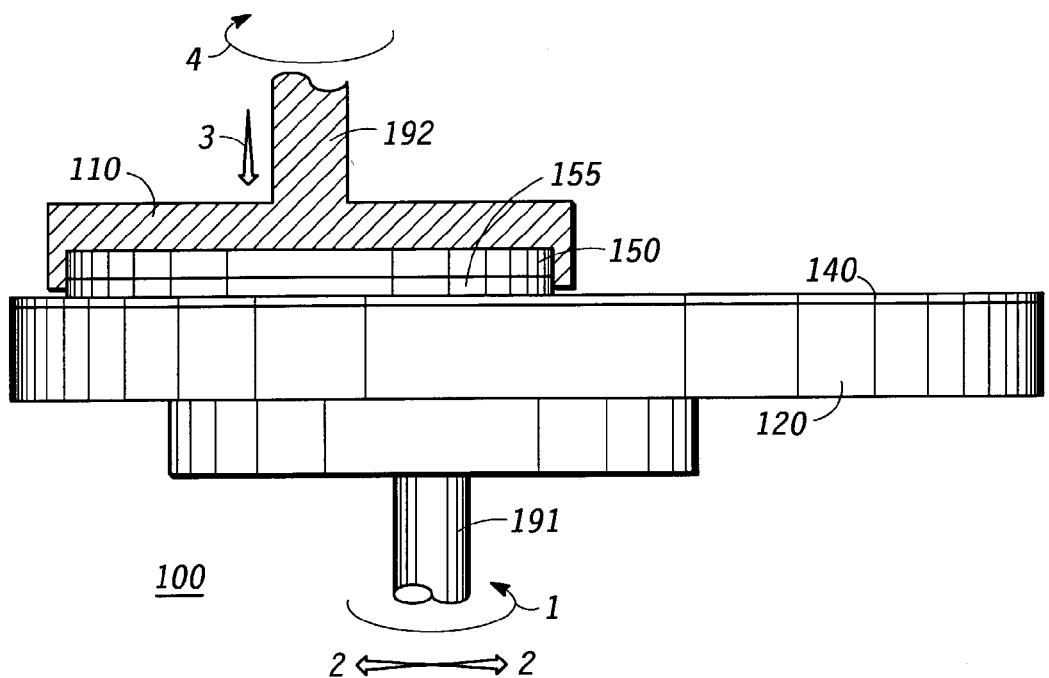
FIG. 1 illustrates a schematic of a chemical mechanical polishing (CMP) processing tool that can be used in conjunction with an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

To reduce the number of surface defects formed during chemical mechanical polishing (CMP) of a semiconductor wafer, a block copolymer surfactant (BCS) is added to a CMP slurry, a CMP rinse, a CMP clean, combinations of the above, or the like. A surfactant is a surface-active agent that reduces surface tension of a liquid or surface tension between a liquid and a solid. For example, by adding a surfactant to water, the surface tension is reduced from 72 dynes/cm to a range between 30 and 50 dynes/cm. The BCS is a nonionic surfactant, which is desirable to avoid contaminating a semiconductor wafer during processing with metal ions, such as sodium ($Na^+$) and potassium ($K^+$), which can destroy a semiconductor device.

BCS is a type of nonionic polymer surfactant that is composed of two or more monomers organized in block sequences. A block copolymer is a repetitive pattern of at least a first monomer and a second monomer. In addition, the block copolymer may have any number of monomers, for example, the block copolymer can be a triblock copolymer, meaning it is a product of three different monomers. The block sequences are typically incompatible (relative hydrophillicity). Because of this incompatibility between the blocks, there is always one or more blocks classified as the hydrophobic block and one or more blocks classified the hydrophilic block, as will be explained in more detail below. A block copolymer is used so that the hydrophobic and hydrophilic moieties are discrete repetitive sequences that allow for effective separation of hydrophobic and hydrophilic moieties. In one embodiment, the BCS is a polyoxyalkylene-based polymer, meaning there is a polymer with oxygen and carbon in the backbone and that at least one of the monomer unit(s) contains a double bond. The backbone of the polymer, however, may not have double bonds. In another embodiment, a polymer with at least oxygen in the backbone is be used.

Both the molecular weight (MW) and molecular composition of each block are chosen to provide desired functional properties and may be formulated for various applications (e.g. wetability, surface tension, foaming, and particle aggregation). In addition the size or MW of each block relative to the other blocks of the surfactant is chosen to provide optimal overall performance. Tailoring block lengths relative to the length of other blocks creates surfactants with specific separation distances between blocks. The hydrophilic moieties are typically block sequences of ethylene-oxide (EO), which has the chemical formula of $(CH_2CH_2O)_n$, and the hydrophobic moieties are typically propylene-oxide (PO), which have the chemical formula $(CH_2CH_2CH_2O)_n$. In a preferred embodiment the MW of the PO block is 2100 and the MW of the EO block is 1300. In addition, the MW of the PO block relative to the EO block is about 1.5 to 1. In addition, BCS has duality molecular characteristics. More specifically, BCS is composed of one or more polar or hydrophilic (water attracting) moieties in conjunction with one or more non-polar or hydrophobic (water repelling) moieties.

In practice, various materials with very different wetability characteristics can be exposed on the wafers surface at the same time. For example, when polishing wafers with inlaid interconnects, metal conductors, diffusion barriers, and dielectric materials may be present simultaneously. In these embodiments, the dielectric materials (such as $SiO_2$)

may be relatively more hydrophilic than the metal surfaces (such as passivated Cu). The degree of wetability depends on their chemical and physical nature (porosity, oxidation state, and passivation), thus the surface does not wet homogeneously without a surfactant The presence of the BCS in the aqueous solution promotes homogeneous wetting because the surface tension of water is reduced over the entire surface area of the wafer. The same surface behavior applies to the surface of the wafer upon drying, where surfactants allow homogeneous drying and do not promote stains or other undesirable products. Multiple variations are possible in the type, formation and arrangement of the moieties that compromise a surfactant. Specifically, block copolymer surfactants (BCS) have been used to enhance the performance of CMP solutions.

In an alternate embodiment, the carbon in the backbone of the polyoxyalkylene-based surfactant may be replaced with silicon to form a silicone and used as the BCS in one embodiment. The silicone-containing block copolymer may include hydrophobic and hydrophilic moieties by adding organic moieties that are hydrophobic and hydrophilic. However, if it does not contain organic moieties the silicone-containing block co-polymer may function in a similar manner as the BCS with hydrophobic and hydrophilic moieties. In this embodiment, moieties of the silicone-containing block co-polymer may have a preferential affinity to the surface of dielectrics including silica. Therefore, using a silicone-containing block co-polymer as the surfactant is most useful when a high percentage (e.g. greater than or equal to 50% percent) of the exposed surface includes silica. This is more likely to occur at metal levels with low metal (e.g., copper) surface area or via levels. In addition, the feature size of the non-silica containing material should be under a micron because if the feature size is larger it is unlikely that the silicone-containing block co-polymer will cover the area without having a hydrophobic or hydrophilic moiety.

The concentration of the surfactant should be below the critical micelle concentration (CMC) of the surfactant. The CMC is the concentration above which micelles (a colloidal aggregate of surfactant molecules) are created and the surfactant undesirably stops coating a surface. In one embodiment, the concentration of the BCS in the aqueous solution is less than about one weight percent, which corresponds to approximately 10,000 parts per million (ppm). Preferably, the concentration is approximately 100 to 300 ppm, or more preferably, about 250 ppm, which is approximately 0.025 weight percent. In one embodiment, the concentration is approximately 10 to 500 ppm. Preferably, these concentrations are used with a BCS including EO and PO. The amount of BCS used here is less than approximately 10 to 100 times what is used with other chemicals that may be added to slurries to try to reduce surface defects, such as PEG.

It has been shown that precipitate defects are minimized when adding 250 ppm of BCS to CMP solutions and any additional quantities of BCS do not yield further improvement. Precipitate defects are clusters of material that are believed to include carbon and typically reside on or near surfaces with exposed copper. Much is unknown as to the cause and the exact composition of precipitates. However, it is desirable to decrease the number of precipitates as they lead to yield loss and reliability problems.

The minimal amount (i.e., <250 ppm) of BCS as opposed to larger quantities of other surfactants creates a more manufacturable process. For example, filters do not clog as quickly and therefore do not need to be replaced as often, which decreases cost of manufacturing. In addition, work time is reduced because filters and empty chemical drums do not need to be replaced with new filters and full chemical drums, respectively.

In addition, to avoid the formation of micelles, the temperature of the aqueous solution should be below the temperature of the cloud point for the BCS. The cloud point is the temperature above which micelles form and the surfactant appears cloudy. Thus, in one embodiment the temperature of the aqueous solutions is less than approximately 50 degrees Celsius for a block copolymer of EO and PO.

Adsorption of the BCS to particles in a slurry also results in steric stabilization of the particles. Particles with adsorbed BCS molecules require more energy to join and thus slurry agglomeration may be prevented. Agglomeration of CMP slurries is undesirable because it changes the performance of the slurry, causes filters to clog, and creates defects (e.g., scratches and gauges) on a wafer's surfaces. In addition, steric stabilized slurries are less sensitive to changes in the solution properties (i.e., electrolyte concentration and pH) which can also cause agglomeration.

The molecular weight of the surfactant can be chosen to tailor the polishing properties of the BCS and, hence, the aqueous solution. For example, the particle size in slurry dispersions is chosen to achieve optimum removal characteristics for the material to be polished in given pH environment. For smaller particles (e.g., below 20 nm) a lower molecular weight and thus smaller size BCS should be selected to achieve optimal particle coverage. A large BCS molecule would be undesirable in this case because particle aggregation or settling may occur. The properties of the BCS and aqueous solution can also be tailored based upon the ratio of a monomer to another monomer in a copolymer. For example, altering the ratio of the monomers in the BCS can increase the amount of foaming of the surfactant. More specifically, increasing the amount of PEO in a copolymer of PEO and PPO increases the amount of foaming. When chemically mechanically polishing particles are moved around in the aqueous solution, the foam, if present, takes up and retains particles so they do not deposit on the exposed surface of the semiconductor wafer or continue to move around in the aqueous solution. When the foam is removed (e.g. washed away), the particles in the foam are also removed. The desirability of foaming depends on the application. Although removal of particles with the foam is desirable so that the particles do not deposit on the semiconductor wafer, foam is undesirable, for example, when drying the semiconductor wafer by spinning. Since the foam is not very dense, when spinning the semiconductor wafer, the foam will easily move to certain portions of the semiconductor wafer (e.g. near the edges). Because the foam is nonuniformly coating the semiconductor wafer, portions of the semiconductor wafer (i.e. portions of the wafer not covered with the foam) will dry faster than other portions (i.e. portions of the wafer covered with foam). The molecular weight of the BCS, in one embodiment, is 8400 and more preferably, is 3100. It is desirable that the molecular weight be above approximately 1000 in order for the nonionic surfactant to have a beneficial effect in the aqueous solution. If the molecular weight of the surfactant is below this minimum then the surfactant will be so small that it does not contribute to the properties of the aqueous solution. In addition, the molecular weight of a BCS should be below approximately 15000, because if the surfactant is too large, the surfactant may not be soluble in the aqueous solution as desired. In addition, too large of a surfactant may increase defectivity issues because the surfactants are more likely to aggregate. Thus, aggregation (gel formation) is more likely to occur for BCS with high PEO to PPO ratio and high total molecular weight.

The BCS described above can be used in any aqueous solution used to polish a semiconductor wafer. A simplified diagram of a CMP processing tool 100 that can be used to polish a film 155 formed over a semiconductor wafer or substrate 150 is shown in FIG. 1. The semiconductor wafer 150 can be silicon, gallium arsenide, silicon germanium a silicon-on-insulator (SOI) wafer, or the like. The film 155 can be a metal film that includes tungsten, aluminum, copper, tantalum, the like, or combinations of the above. In one embodiment, the film 155 is a dielectric such as silicon oxide, a high dielectric constant dielectric (e.g. $HfO_2$), the like, or combinations of the above. Alternatively, the film 155 can be a stack of materials, such as a low dielectric constant material with a capping layer of silicon dioxide and a trench formed in the low dielectric constant material and the capping layer, wherein the trench is filled with a barrier layer of tantalum and a metal interconnect including copper.

As illustrated, the CMP processing tool 100 includes a head 110, a platen 120, a CMP pad 140, a drive assembly 191 and an actuator assembly 192. The assembly 191 rotates the platen 120 as indicated by a first arrow 1 or reciprocates the platen 120 back and forth as indicated by a second arrow 2. The head 110 may be a weighted, free-floating carrier and the actuator assembly 192 may be attached to the head 110 to impart axial and rotational motion, as indicated by a third arrow 3 and a fourth arrow 4, respectively. The semiconductor wafer 150 is positioned so that the film 155 touches the CMP pad 140 during operation. As the head 110 and the platen 120 move relative to each other, a slurry, which is dispensed from a nozzle 160, and the CMP pad 140 are used to polish the film 155 by removing the material. The slurry removes portions of the film 155 chemically by etching and oxidizing the surface of the semiconductor wafer 150. The slurry also mechanically polishes the film 155 in conjunction with the CMP pad 140 by applying a pressure with the CMP pad 140 that exerts a pressure on abrasives (e.g. silica particles) in the slurry, which in turn grind the surface of the film 155. The semiconductor wafer 150 may be held during operation using well-known means such as vacuum pressure or edge clamps.

Figure 2:
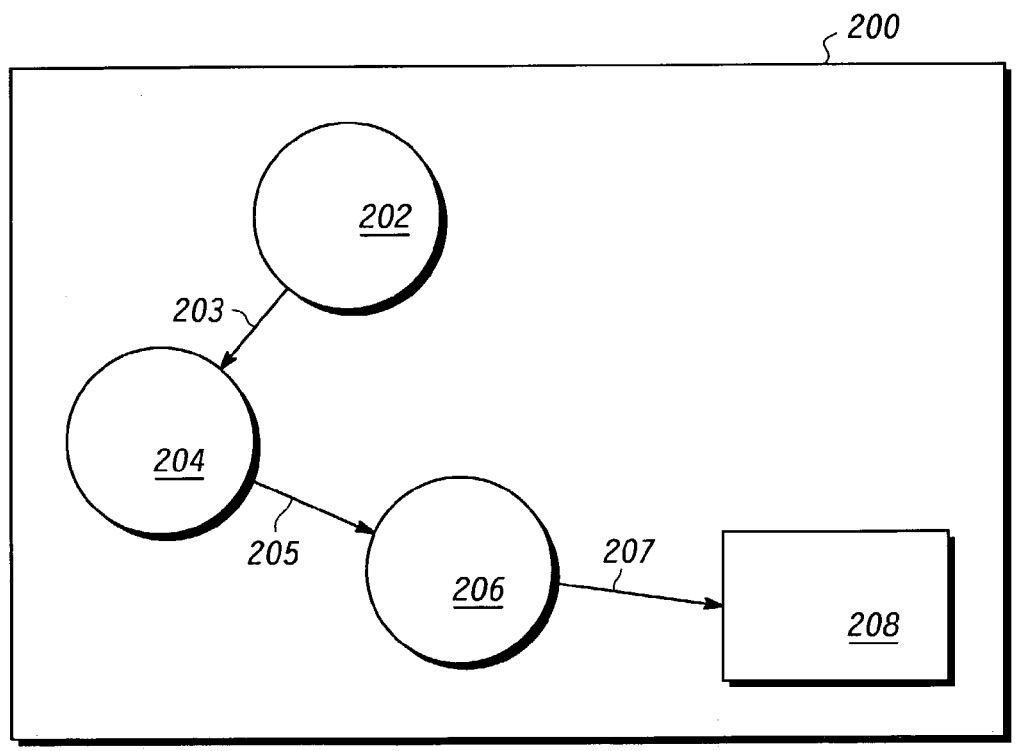
FIG. 2 illustrates a schematic of a CMP processing system that includes the CMP processing tool of FIG. 1.

The CMP processing tool 100 shown in FIG. 1 is part of a CMP processing system 200, shown in FIG. 2. The CMP processing system 200 includes a first platen 202, a second platen 204, a third platen 206, and a scrubber or noncontact cleaning tool 208. Typically, the first platen 202, the second platen 204, and the third platen 206 are part of the same tool. The scrubber 208 may or may not be part of the same tool as the first, second and third platens 202, 204 and 206.

A copper polishing process for forming a copper trench will be described in regards to using the CMP processing system 200 of FIG. 2. When ready for the copper polishing process (module), a semiconductor wafer is provided, which includes a trench in a dielectric layer (e.g. silicon dioxide), wherein the trench is filled with a thin barrier layer (e.g. tantalum) and a bulk metal (e.g., copper). The barrier layer and the bulk metal both lie within the trench and over the dielectric layer. The portions of the barrier layer and the bulk metal that are not within the trench are the undesirable barrier layer portion and the undesirable copper portion, respectively, that will be removed during polishing.

In one embodiment of a copper polishing process, the semiconductor wafer is placed on the first platen 202 to remove a portion of the undesirable copper portion. Hence, some of the undesirable copper portion remains after polishing using the first platen 202. This occurs because the first platen 202 quickly polishes the undesirable copper portion and then the rest of the undesirable copper portion is removed slowly using the second platen 202. To polish the copper, a first CMP slurry is used. In one embodiment, the first CMP slurry includes abrasive particles (e.g. aluminum-containing (alumina), ceria-containing (ceria) or silicon-containing (silica) particles), a copper soluble solution or complexing agent (e.g. citric acid), an oxidizing agent (e.g. $H_2O_2$), water, and a surfactant, as described above. A complexing agent may not be required if copper ions are soluble at the slurry's pH. The first CMP slurry may also include a corrosion inhibitor to reduce pitting (chemical etching) of the copper and probably has a biocide to deter fungus growth on the first platen 202 and other equipment that the first CMP slurry contacts.

After polishing the undesirable copper layer, the semiconductor wafer is moved to the second platen 204 manually or by a robot, as shown by arrow 203, in FIG. 2. As described above, the second platen 204 is used to remove any remaining undesirable copper layer. Typically, the polishing process using the second platen 204 endpoints on the undesirable barrier layer. Usually, a harder CMP pad than that used on the first platen 202 is used on the second platen 205. Typically, the first CMP slurry is also used with the second platen 204. Hence, it may be desirable to use the same platen for removing all of the undesirable copper portion.

After removing substantially all of the undesirable copper portion and perhaps portions of the undesirable barrier layer, the semiconductor wafer is transferred manually or automatically (e.g. robot) to the third platen 206, as shown by arrow 205 in FIG. 2. The polishing using the third platen 206 (a buff polish), typically uses a soft buff pad to remove the undesirable barrier layer and any capping dielectric layer that may have been formed over a low dielectric constant material. Typically, the capping dielectric is not a low dielectric constant material and, therefore, it is desired that the capping dielectric be removed. The slurry used to polish using the third platen 206 (a second CMP slurry or buff slurry) can be the same as the first CMP slurry except the second CMP slurry may not include the oxidizing agent. In addition, it is desirable that the second CMP slurry does not include the copper soluble solution so that the copper that remains, which is within the trench, is not removed. Although all of the slurries used on the first, second and third platens 202, 204 and 206 include a surfactant it is not necessary that the same surfactant be used in each process.

After the polishing is finished using the third platen 206, a rinse is typically performed on the third platen 206. In a preferred embodiment, the rinse includes water, a surfactant that may or may not be the same as the surfactants in the CMP slurries, and a biocide. After rinsing the semiconductor wafer, the semiconductor wafer may be placed in a holding tank (not shown) and then transferred to the scrubber 208. Alternately, the semiconductor wafer is transferred from the third platen 206 to the scrubber 208 as shown by arrow 207 in FIG. 2.

The scrubber 208 includes a rinse, brush and drying stations (not shown) and an aqueous solution. In one embodiment, the aqueous solution used for the scrubber 208 includes a chemical to adjust a zeta potential of alumina particles (e.g. citric acid), water, and a surfactant, as previously described. The surfactant may or may not be the same one used in the other processes discussed. If the semiconductor wafer in the scrubber 208 has an exposed dielectric (e.g. oxide), then it may be desirable to have a more basic pH and thus ammonia may be added to the aqueous solution in the scrubber 208. The zeta potential indicates the surface charge that inherently exists when a material (e.g. a semiconductor wafer, particle) is in contact with a liquid ions (e.g. aqueous solution). The debye length indicates the distance to which the surface charge extends. The combination of debye length and zeta potential can be used to predict and control the stability of the particle dispersion. Greater debye lengths and zeta potentials result in a lesser probability that particles in the dispersion will aggregate together.

Although the use of the BCS is described in regards to FIGS. 1 and 2 as being used in a CMP process, the BCS can be used in other processes in semiconductor manufacturing. For example, the addition of a BCS to a wet etch process or module may be desirable to protect surfaces while undesired particles or materials are etched away. In addition, the addition of a BCS can be used in industries outside semiconductor manufacturing. For example, adding a BCS to polishing slurry for polishing a glass used in optics may be desirable to uniformly polish surfaces and protect glass surfaces from scratches and gauges, an undesirable product in the optics industry.

Based on the above discussion, a skilled artisan should recognize that use of BCS in semiconductor manufacturing where the wafer is exposed to aqueous solutions. Primarily, BCS is an effective addition to CMP slurries, CMP rinses, CMP cleaning solution in reducing surface defectivity. In particular, BCS has been shown to minimize precipitate defects (a.k.a. organic residual, stains and carbon residual). It has been shown through experimentation that precipitate defects can be reduced by 2-10 times be adding BCS to the CMP slurry, CMP rinse and CMP clean. The amount of reduction depends on where the BCS is added as well as the amount of copper that is exposed during the process. Since the amount of exposed surface area of copper is directly proportional to the number of precipitate defects formed, adding BCS to a solution has the greatest effect on a semiconductor wafer that has a large amount of copper (e.g., at least approximately 80%) exposed It is most likely that a larger amount of copper is exposed at the top or higher metal layer than the lowest or first metal layer of the semiconductor wafer. The first metal layer may only include vias or contacts that have a small surface area, whereas metal layers that are at higher levels will have metal interconnects that are connected together by long wide metal lines, which have large surface areas. The decrease in the number of precipitate defects desirably increases manufacturing yield.

Another advantage of employing of BCS in CMP slurries, CMP rinses or CMP cleaning solutions is that when a BCS absorbs to an exposed surface, the depth of the shear plane for that interface increases. This is true for all surfaces that the BCS contacts including the wafer's surface, the particle surface, and any other interfaces associated with the CMP equipment. An increase in the shear plane means that more force is necessary to bring two or more interfaces into contact.

The increase in the depth of shear plane has other advantages for the CMP rinses and the CMP cleaning solutions. First, more energy is needed for particles in solution to settle on the surface, therefore fewer particles settle on the surface and overall defect levels are lower. In addition, particles that are removed from the surface when using the CMP rinse and CMP cleaning solutions are less likely to resettle on the surface. Also particles that have settled into a double-layer minimum, the distance from the surface at which the Van der Waals attraction cancels the electrostatic repulsion, may allow BCS to absorb underneath them. The BCS then expands due to the repulsion of the hydrophobic and hydrophilic groups and lifts the particle further away from the surface where it can be removed by traditional methods.

Additionally, other compounds added to CMP solutions (i.e., biocides) that may cause aggregation or particle problems may be stabilized by the addition of BCS. Another advantage of using BCS is the potential improvement in polish performance. Polish performance (dishing and erosion) is improved by reduction of dielectric removal rates due to the formation of a densely packed adsorbed layer of the BCS (self-assembled) on the surface of the dielectric. Changes in dielectric surface affect the removal rates and may result in either a more selective or a less selective process depending on the solution chemistry and physical process parameters. One skilled in the select the surfactant and process parameters to limit dishing and erosion.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for processing semiconductor wafers, comprising:
providing a semiconductor wafer having a wafer surface to semiconductor processing stage; and
applying a block copolymer surfactant having a hydrophobic portion and a hydrophilic portion to the wafer surface during the semiconductor processing stage, wherein providing the semiconductor wafer to the semiconductor processing stage comprises providing the semiconductor wafer to an etch system.

2. The method of claim 1, wherein the block copolymer surfactant comprises a polyoxyalkylene-based polymer.

3. The method of claim 1, wherein the hydrophobic portion comprises a propylene oxide and the hydrophilic portion comprises an ethylene oxide.

4. The method of claim 1, wherein the wafer surface comprises a region of exposed copper.

5. The method of claim 1, wherein the block copolymer surfactant is within an aqueous solution, and the concentration of the block copolymer surfactant within the aqueous solution is less than one percent by weight.

6. The method of claim 5, wherein the concentration is less than 0.5 percent by weight.

* * * * *